United States Patent
Däche et al.

(10) Patent No.: US 7,037,844 B2
(45) Date of Patent: May 2, 2006

(54) METHOD FOR MANUFACTURING A HOUSING FOR A CHIP HAVING A MICROMECHANICAL STRUCTURE

(75) Inventors: Frank Däche, München (DE); Jochen Dangelmaier, Beratzhausen (DE); Günter Ehrler, Holzkirchen (DE); Andreas Meckes, München (DE); Michael Weber, Mainburg (DE)

(73) Assignee: Infineon Technologies AG, Munich (DE)

( * ) Notice: Subject to any disclaimer, the term of this patent is extended or adjusted under 35 U.S.C. 154(b) by 228 days.

(21) Appl. No.: 10/679,170

(22) Filed: Oct. 2, 2003

(65) Prior Publication Data

US 2004/0067650 A1  Apr. 8, 2004

(30) Foreign Application Priority Data

Oct. 2, 2002  (DE) ................................. 102 46 101

(51) Int. Cl.
*H01L 21/302*  (2006.01)

(52) U.S. Cl. .................. 438/706; 438/106; 438/107; 438/745

(58) Field of Classification Search ................ 438/706, 438/710, 712, 723–725, 745–756, 757, 106, 438/107
See application file for complete search history.

(56) References Cited

U.S. PATENT DOCUMENTS 5,567,656 A  10/1996  Chun

| | | | |
|---|---|---|---|
| 6,489,178 B1 * | 12/2002 | Coyle et al. | 438/51 |
| 6,622,380 B1 * | 9/2003 | Grigg | 29/840 |
| 6,800,210 B1 * | 10/2004 | Patel et al. | 216/2 |
| 6,900,072 B1 * | 5/2005 | Patel et al. | 438/106 |
| 2001/0001293 A1 | 5/2001 | Gotoh et al. | |
| 2002/0197761 A1 * | 12/2002 | Patel et al. | 438/52 |
| 2003/0102538 A1 | 6/2003 | Paulus | |

FOREIGN PATENT DOCUMENTS

| | | |
|---|---|---|
| DE | 100 31 204 A1 | 1/2002 |
| EP | 0 794 616 A2 | 9/1997 |
| JP | 06005608 A | 1/1994 |
| WO | 99/52209 | 10/1999 |

* cited by examiner

*Primary Examiner*—Kin-Chan Chen

(74) *Attorney, Agent, or Firm*—Laurence A. Greenberg; Werner H. Stemer; Ralph E. Locher

(57) ABSTRACT

A method for manufacturing a chip housing includes a first basis having a photolithograpically structurable layer on a main face, structured into a cover. A chip has the structure at a main face between first contact elements. A second photolithograpically structurable layer applied to the main face is structured forming a recess surrounded by a wall near the structure exposing the first contact elements. Then, the first basis and the chip are merged with the structure and the cover facing and aligned with each other, and the recess closed by the cover. Removing the first basis leads to an on-chip cavity. Afterwards, a second basis and the chip are merged with the first contact elements connected to the second basis via a conductive structure. Afterwards, the second basis is removed for exposing the conductive structure. The method is less subject to cost and size limitations of known housing technologies.

13 Claims, 4 Drawing Sheets

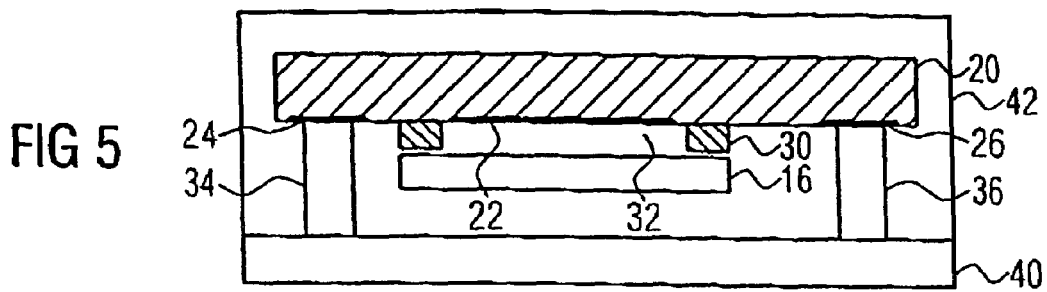
FIG 5
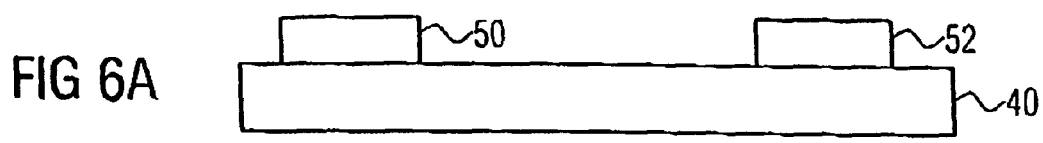
FIG 6A
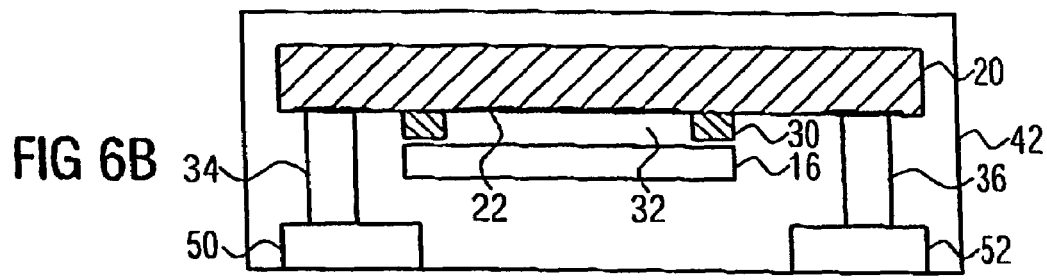
FIG 6B
FIG 7A
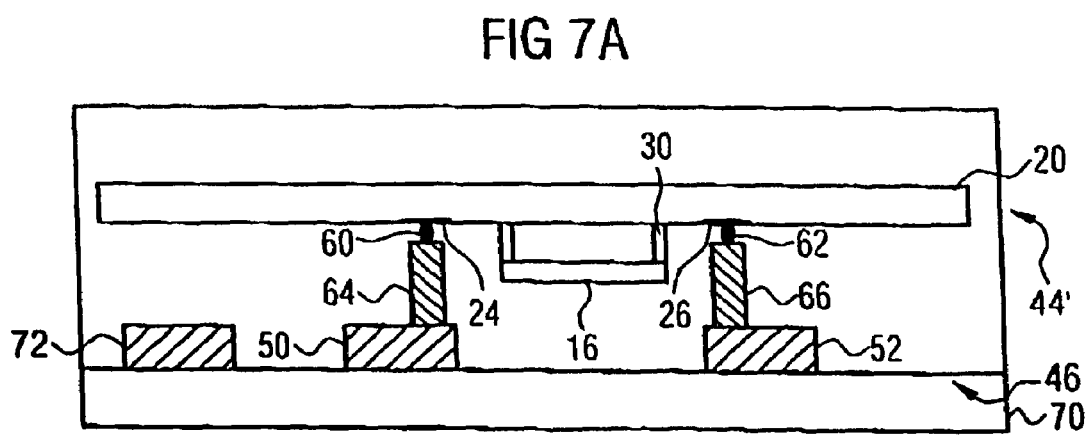

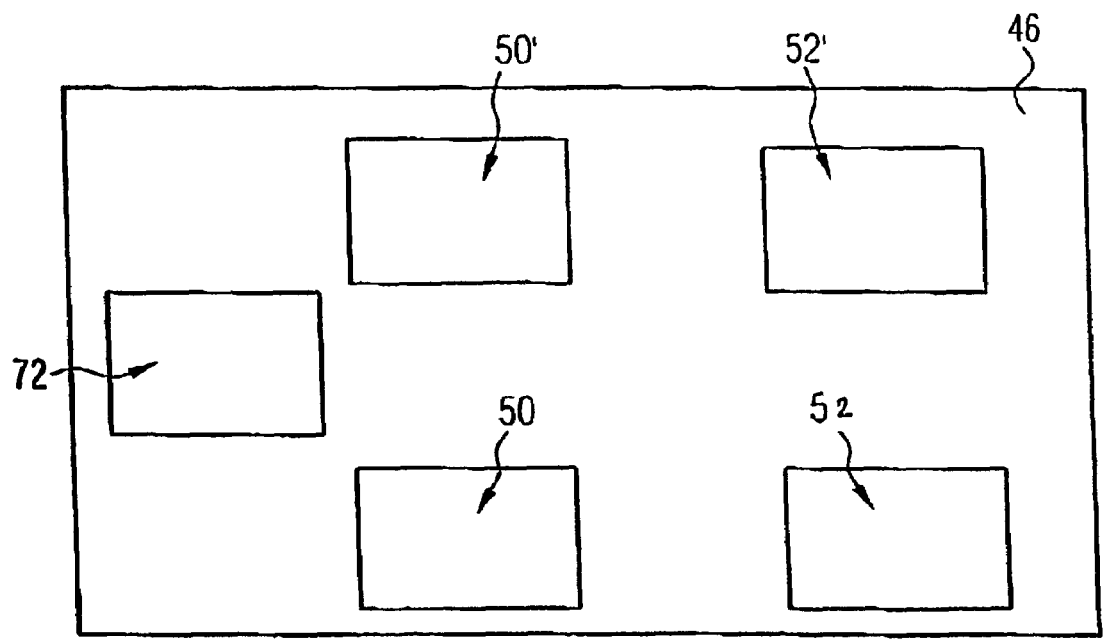

METHOD FOR MANUFACTURING A HOUSING FOR A CHIP HAVING A MICROMECHANICAL STRUCTURE

FIELD OF THE INVENTION

The present invention relates to a method for manufacturing a housing for a chip having a micromechanical structure.

BACKGROUND OF THE INVENTION AND PRIOR ART

Chips having micromechanical structures or so-called micromechanical circuits, respectively, have an increasing market proportion with high frequency circuits and frequency filters. One of the main markets for chips of that kind having micromechanical structures is the mobile communication market. A chip having a micromechanical structure which is also referred to as a micromechanical circuit is a semiconductor device which is implemented with a micromechanical structure on its surface. For such circuits individual housing technologies are required, wherein the housing needs to determine a cavity around the micromechanical structure.

A common practice for housing the chip having a micromechanical structure known in the prior art is to use a housing element with a cavity consisting of ceramic. These ceramic housing structures are both too expensive and too large for the technology requirements resulting today. Typical dimensions of such ceramic housings for a chip having a micromechanical structure are about 3 mm×3 mm×1.3 mm. These dimensions may not be further reduced using the common ceramic housing technologies.

An alternative method is proposed by WO 9952209 A1 which discloses a method for housing an acousto wave device without the contamination of an active region arranged on a main face of same. A substrate, which comprises conductive pads and a dyke 26 on the top side of the same is connected to the acousto wave device, such that the main face of the acousto wave device 10 and the top side of the substrate are opposing, whereby a cavity around the active region is formed and the conductive pads are connected to contact bumps on the acousto wave device. The resulting housing structure includes the acousto wave device, the substrate and the cavity lying between the same, which is successively surrounded by an underfiller material. The considerable height due to the presence of a mounting substrate is a disadvantage of the resulting structure.

Based on this prior art the present invention is therefore based on the object to provide a method for manufacturing a housing for a chip having a micromechanical structure, which is no longer subject to the cost and size limitations of known housing technologies.

SUMMARY OF THE INVENTION

In accordance with a first aspect of the invention, this object is achieved by a method for manufacturing a housing for a chip having a micromechanical structure, comprising the following steps:

(a) providing a first basis which comprises a photolithographically structurable layer on at least a partial region of a main face;

(b) photolithographically structuring the first photolithographically structurable layer to obtain a cover for the micromechanical structure;

(c) providing a chip comprising the micromechanical structure, which is arranged at a main face of the chip between the first contact elements;

(d) applying a second photolithographically structurable layer on at least a partial region of the main face of the chip;

(e) photolithographically structuring the second photolithographically structurable layer for generating a recess surrounded by a wall in the photolithographically structurable layer in the region of the micromechanical structure and for exposing the first contact elements;

(f) merging the first basis and the chip in a way so that the micromechanical structure and the cover are facing each other and are aligned with each other, so that the recess is closed by the cover, whereby an on-chip cavity is obtained;

(g) removing the first basis in order to obtain a chip comprising an on-chip cavity;

(h) merging a second basis and the chip comprising the on-chip cavity in such a way that the first contact elements are connected to the second basis via a conductive structure; and (i) removing the second basis for exposing the conductive structure.

According to an inventive method, on a main surface of a first basis a first photolithographically structurable layer is applied within at least one partial region of the main surface of the first basis and is structured photolithographically in order to obtain a cover for the micromechanical structure. A second photolithographically structurable layer is applied to at least one partial region of the main face of a chip with the micromechanical structure, which is arranged at a main face of the chip between first contact elements, and is photolithographically structured in a suitable way in order to generate a recess surrounded by a wall in the second photolithographically structurable layer in the region of the micromechanical structure and to expose the first contact elements. Subsequently, the first basis and the chip are merged in a way so that the micromechanical structure and the cover are facing each other and are aligned with each other, so that a recess is closed by the cover, whereby an on-chip cavity is obtained. By removing the basis a chip having an on-chip recess is thus obtained. A second basis is merged with the thus obtained chip having an on-chip cavity, in such a way, that the first contact elements are connected to the second basis via a conductive structure. Finally, the second basis is removed for exposing the conductive structure.

BRIEF DESCRIPTION OF THE DRAWINGS

In the following, preferred embodiments of the present invention are explained in more detail with reference to the accompanying drawings, in which:

FIG. 5 shows a structure which is set in a step corresponding to the method step of FIG. 4B according to a transformed embodiment of the method;

FIG. 6A shows a second basis provided with metal islands for manufacturing the housing according to a further embodiment of the present invention;

FIG. 6B shows a structure which is set according to a method step corresponding to the step of FIG. 4C when using the second basis according to FIG. 6A; and FIGS. 7A and 7B show a front view and a bottom view of a structure resulting upon two method steps corresponding to the step of FIG. 4B according to a further embodiment of the present invention.

DETAILED DESCRIPTION OF PREFERRED EMBODIMENTS

Figure 1A:
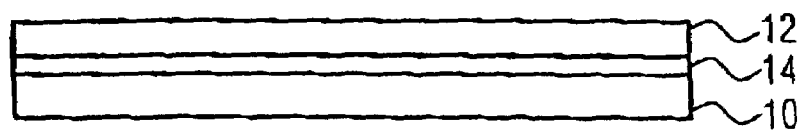
FIGS. 1A and 1B show a first basis, which serves as a support of the cover for the cavity around the micromechanical structure, in two method steps according to one embodiment of the present invention.

Before preferred embodiments of the present invention are discussed in more detail with reference to the figures, it is noted that similar elements or elements with the same functions are provided with the same or similar reference numerals in the figures, respectively, and that for preventing repetitions a renewed description of these elements is omitted.

Figure 1B:
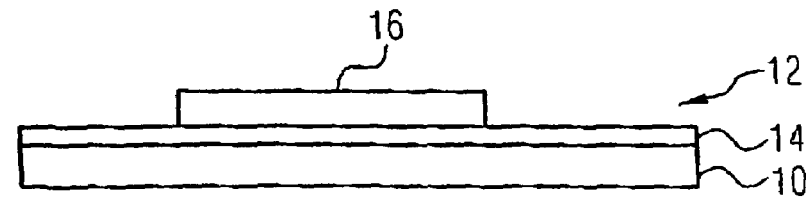

In the method steps of FIGS. 1A and 1B first of all the preparation of a support wafer or of a first basis is described, respectively, which is to serve as a support for a cover for a cavity which surrounds a micromechanical structure of a chip for which the housing is to be produced.

As it is shown in FIG. 1A, first of all the support wafer 10 is provided, which consists for example of a semiconductor material, like e.g. Si. Alternatively, any other material may be used for the first basis 10, which is compatible with the process steps to be discussed in the following. On a main face of the wafer 10 a photosensitive epoxy layer 12 is located, wherein between the epoxy layer 12 and the wafer 10 a sacrificial layer 14 is arranged. The sacrificial layer 14 serves to separate the wafer 10 from a cover formed from the epoxy layer 12, as it is discussed in the following.

As it is shown in FIG. 1B, in a next method step a photolithographic structuring of the photosensitive epoxy layer 12 is performed to obtain an epoxy region 16 which is to serve as the cover for the micromechanical structure. With this photolithography at least those regions of the photosensitive epoxy layer 12 need to be exposed, so that they remain after the developing, which are opposed to the "active" region around the micromechanical structure of the chip after the arrangement of the housing.

Figure 2A:
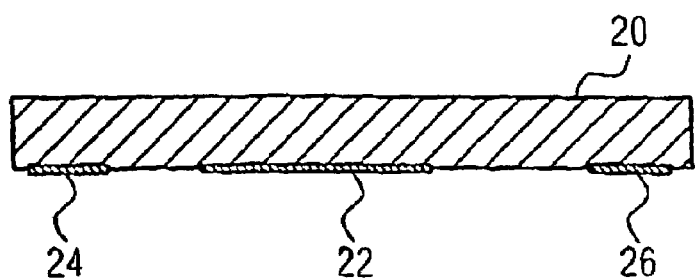
FIGS. 2A–2C show a chip having the micromechanical structure in three further method steps for manufacturing the housing according to an embodiment of the present invention.
Figure 2B:
Figure 2C:
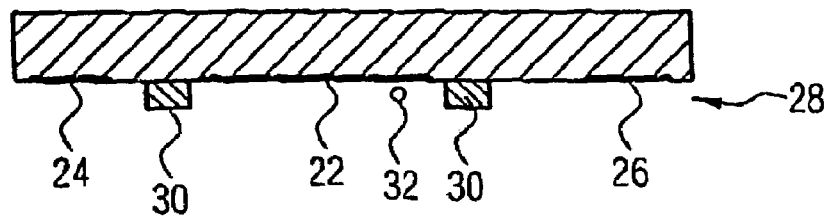

The method steps to be explained now with reference to FIGS. 2A to 2C are implemented at the chip 20 including the micromechanical structure. The term "chip" as defined by the present invention is any semiconductor device on which a micromechanical structure is implemented. As a micromechanical structure, for example a BAW filter (BAW=bulk acoustic wave) is conceivable.

As it is shown in FIG. 2A, the chip comprises a micromechanical structure 22 at its bottom, which is connected to contact bumps 24, 26 arranged also at the bottom of the chip 20. As far as the provided chip 20 comprising the micromechanical structure does not yet comprise these contact bumps 24, 26, the performance of a corresponding metallization method step is required for generating the bottom contact bumps 24, 26 ("underbump metalization").

In the method step shown in FIG. 2B a coating onto the surface of the chip or the semiconductor wafer 20, respectively, is performed for example by spin coating using a photosensitive epoxy layer. This spin coating may be repeated several times for building up a desired layer thickness which determines the thickness of the cavity to be realized later, until a second photosensitive epoxy layer 28 of the desired thickness has built up on the bottom of the chip 20.

As it is illustrated in FIG. 2C, now a photolithographic structuring of the second epoxy layer 28 is performed for generating a recess 32 surrounded by a wall or a dyke 30, respectively, and for exposing the contact bumps 24, 26. The wall 30 encloses the "active region" around the micromechanical structure 22.

Figure 3A:
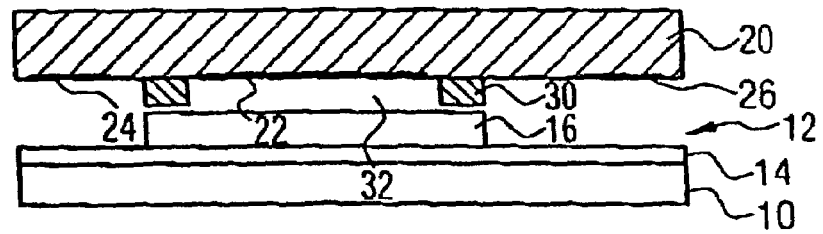
FIGS. 3A–3C show the first basis manufactured in FIGS. 1A and 1B after merging with the chip from FIGS. 2A–2B in three further method steps for manufacturing the housing according to an embodiment of the present invention.
Figure 3B:
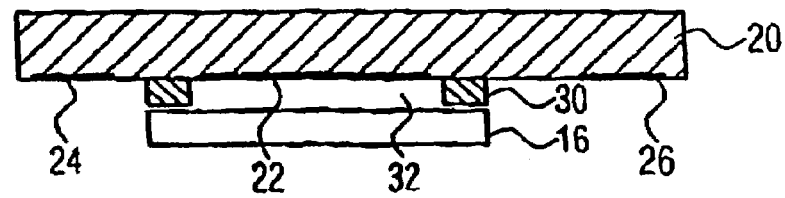
Figure 3C:
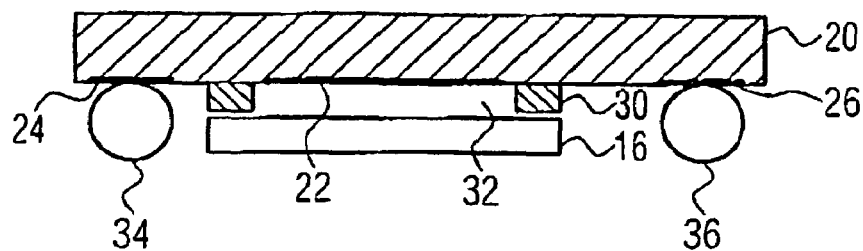

The method steps shown in the following with reference to FIGS. 3A–3C are related to the merging of the chip prepared as described above and the basis prepared as described above and to the processing carried out at the resulting structure.

As it is shown in FIG. 3A, after the preparation of the chip 20 and the basis 10 a first merging step takes place, in which the basis 10 and the chip 20 are merged in such a way that the micromechanical structure 22 and the cover 16 are facing each other and are aligned with each other, so that the recess 32 defined by the wall 30 is closed by the cover 16, whereby an on-chip cavity 32 on the chip 20 around the micromechanical structure 22 is obtained. Consequently, the wall 30 together with the first epoxy layer 12 generates a closed cavity from the recess 32 which surrounds the micromechanical structure 22.

In the following method step shown in FIG. 3B, the support wafer 10 is detached from the epoxy region forming the cover by etching away the sacrificial layer 14 by a suitable etching method. The result is the chip shown in FIG. 3B comprising the on-chip cavity around the micromechanical structure 22. For detaching, however, also an alternative method could be used, like e.g. grinding, wherein the sacrificial layer 14 may be abandoned.

In a method step illustrated in FIG. 3C, soldering pellets 34, 36 are applied to the contact bumps 24, 26. The soldering pellets are used at least as part of a conductive structure, to connect the contact bumps 24, 26 to a basis consisting of copper, which is subsequently removed again, whereby the conductive structure provides a conductive connection path between the contact bumps 24, 26 and the housing bottom or the pad side, respectively. An alternative proceeding for connecting is generating a stud bumping, as it is briefly explained with reference to FIG. 7.

The method steps explained in the following with reference to FIGS. 4A–4C refer to the processing of the on-chip cavity chip, prepared as described above, for closing this structure, wherein for this a further copper basis is used as the sacrificial substrate, to define the lower pad of the final housing when closing the structure and to be removed in the end.

Figure 4A:
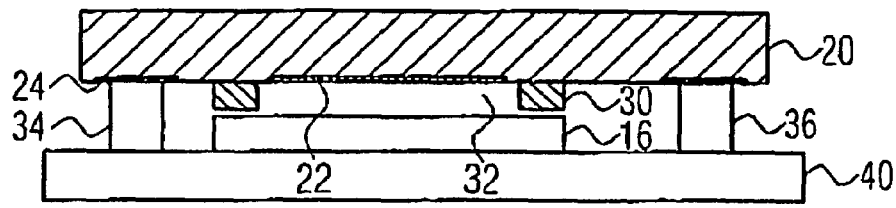
FIGS. 4A–4C show the structure resulting from the method steps of FIGS. 3A–3C after merging with a second basis in three further method steps for manufacturing the housing according to an embodiment of the present invention.

As it is shown in FIG. 4A, first of all the chip having an on-chip cavity, prepared as in FIG. 3C, and a copper basis 40 are merged such that the soldering pellets 34, 36 form a conductive structure from the contact faces 24, 26 up to that main face of the copper basis 40, which faces the chip 20. This connection of the contact bumps 24, 26 to the facing main face of the copper basis 40 is performed by soldering or by a thermocompression process. In the present embodiment the merging is performed such that after merging the chip 20 contacts the copper base plate 40 with the cover 16 of the on-chip cavity 32. The temperatures used in soldering or in the thermocompression process should lie above the temperatures as they are used in the subsequent step of FIG. 4B for closing the structure generated up to here.

Figure 4B:
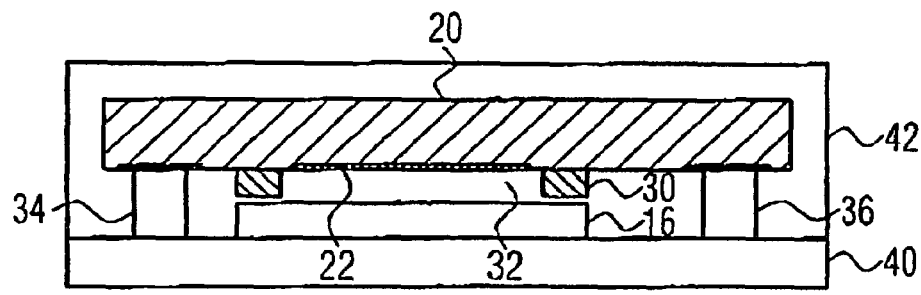
Figure 4C:
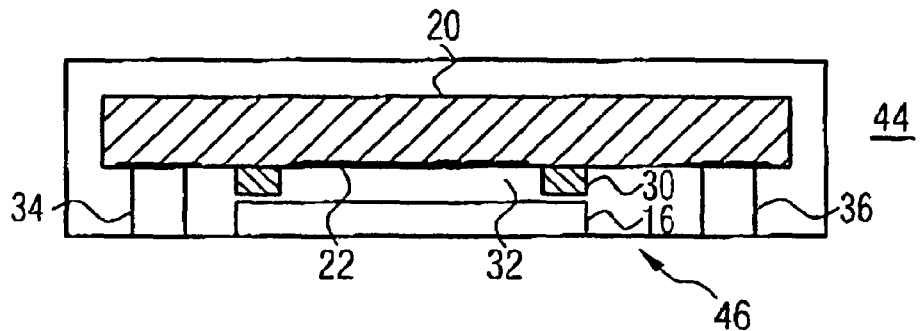

FIG. 4B shows a state as it is set after the next method step, i.e. after closing the so far generated structure of FIG. 4A with a covering layer 42. This method step preferably takes place at an increased temperature level at which a plastics material forming the covering layer 42 is liquefied. In the final sinking of the temperature level a contraction of the plastic material results, which contributes to a solidification of the so far manufactured structure.

In the final method step shown in FIG. 4C, the basis 40 is removed by a copper etching process, whereby the conductive structures formed by the soldering pellets 34, 36 become accessible for a later contacting at the exposed main surface of the structure comprised of the covering layer 42 and the chip 20 comprising the on-chip cavity 34. The thus generated housing is generally indicated by 44 in FIG. 4C. The bottom of the housing 44 generally serving as an attachment face or a contacting face, respectively, is indicated by 46. The bottom 46 is comprised of three parts, i.e. one which is formed by the epoxy of the cover 16, one which is formed by the conductive material of the soldering pellets 34, 36 and one which is formed by the plastic of the covering layer 42.

After performing the copper etching step described with reference to FIG. 4C, preferably a gold plating of the exposed contact regions of the conductive structures 34, 36 is performed at the bottom 46 of the housing 44, which is now exposed.

According to one variation of the above-described method for manufacturing the housing, in the step of FIG. 4A, i.e. the merging of the chip with the on-chip cavity and the copper base plate, the merging is performed such that after merging the soldering pellets 34, 36 result in conductive structures from the contact bumps 24, 26 to the main face of the copper base plate 40 facing the chip and between the epoxy region 16 forming the cover and the main face of the copper base plate 40 facing the chip 20 a gap remains, so that, as it is shown in FIG. 5, after closing the thus resulting structure by the covering layer 42 the structure shown in FIG. 5 results. By the contraction resulting from the decrease of the temperature the plastics material used when closing causes that the wall 30 is firmly pressed to the opposing epoxy portion serving as a cover. For completing the housing according to FIG. 5, only the method steps described with reference to FIG. 4C are to be performed. A housing which is manufactured according to the variation of FIG. 5 is different from the bottom of a housing according to FIG. 4C in that it is only divided into two parts, i.e. one formed by the plastics material of the covering layer 42 and one formed by the contacting structures defined by the soldering pellets 34, 36.

A further variation of the method proceeding described above with reference to FIGS. 1A–4C is described with reference to FIGS. 6A and 6B. In this embodiment instead of the pure copper base plate 40, as it was used in the method step 4A, an already prepared basis 40 is used in which on a main side, which should later be facing the chip having the on-chip cavity during merging, metal islands 50, 52 are formed. Preferably, the metal islands are embodied as nickel-plated islands on the copper basis 40, which are coated with a gold-plating. The way of the arrangement of these islands 50, 52 and the size of these islands 50, 52 is chosen so that they correspond to the contacting bumps 24, 26 at the bottom of the chip 20. In this variation, the copper base plate 40 prepared as shown in FIG. 6A is merged with the chip comprising on-chip cavity as described with reference to FIG. 4A, such that their mentioned main faces are facing each other and that the respectively opposing metal islands 50, 52 and contact bumps 24, 26 are connected to each other via the soldering pellets 34, 36 by soldering or by a thermocompression process, in such a way, that either the epoxy portion 16 forming the cover contacts the copper base plate 40, as it is shown in FIG. 4A, or a gap between the portion 16 and the base plate 40 remains, as it is shown in FIG. 5. The housing resulting according to this variation after performing the steps according to FIGS. 4A–4C is shown in FIG. 6B. The advantage of this proceeding is that the cross-section of the pads or the form of the contact regions, respectively, at the bottom of the housing may be varied as required, which makes it possible to arrange different chips in the housing which have the same contact region arrangement. The metal islands 50, 52 are for example generated or structured, respectively, in a common way by a photo process on the copper base plate 40.

A special embodiment of a housing manufactured according to an inventive method is shown in FIGS. 7A and 7B. FIG. 7A shows a front projection view, while FIG. 7B shows a bottom or mounting side, respectively, of the housing. The housing is generally indicated by 44'. It was manufactured according to the method of FIGS. 1A–4C with the variations of FIGS. 5 and 6A and 6B, i.e. a gap exists between the epoxy 16 forming the cover and the bottom or mounting main face 46 of the housing 44', respectively, and the conductive structures forming the conductive connection to the bottom or mounting side, respectively, of the housing 44' for the contact bumps 24, 26 on the bottom of the chip 20 further include the metal islands 50, 52. As a variation to the solder application step of FIG. 3C, in the housing 44' of FIG. 7A and FIG. 7B a stud bumping was used. The conductive structures providing a conductive connecting path from the contact bumps 24, 26 on the bottom of the chip 20 to the mounting side 46 of the mounting 44' therefore include stud bumps 60, 62, studs of nickel and gold 64, 66 and the metal islands 50, 52 of nickel as mentioned above. In FIG. 7A the housing 44' is illustrated in this state, as the same is already attached to a lead frame or a printed circuit board 70, respectively. In order to adjust the resulting contact area arrangement resulting at the bottom 46 of the housing 44' to the terminal configuration provided on the board 70, and to manufacture a printed circuit board 70 having uniform terminal configurations, the metal islands 50, 52 or 50' and 52', respectively (only visible in FIG. 7B) were suitably arranged and sized on the copper base 40. Additionally, a dummy metal island 72 was formed when structuring the metal on the copper base plate 40, which is not connected to one of the contact bumps on the bottom of the chip 20, but only serves as a dummy terminal for soldering onto the board 70. According to this embodiment of FIGS. 7A and 7B consequently for every chip 20 a terminal configuration may be achieved, as it is shown in FIG. 7B, and which for example serves as a standard configuration.

In other words, for every chip a housing having a terminal configuration may be achieved, which is adjusted to the target terminal configuration on a desired board 70, independent of the number of terminals and the type of the chip to be housed.

As the preceding embodiments showed, it is consequently possible by the present invention to manufacture terminal-compatible housings without additional redistribution layers being necessary for it. Additionally, it is made possible to variably adjust the terminal configuration on the bottom of the housing, i.e. the footprint, to the desires of the customer. Additionally, based on the inventive method, housings with small dimensions may be manufactured, in particular with a small size, like e.g. dimensions of 1.5 mm in the lateral direction and 0.4–0.6 mm in the height direction. Also the pad construction itself may be variably implemented, by providing the metal islands and the interconnecting studs, to be adjusted to the respective connecting technology regarding the board 70, like e.g. soldering, bonding or adhering. In the case of the stud bonding according to FIGS. 7A and 7B, studs without or with overgrowth are possible. Compared to the ceramic housings better anchoring possibilities for the stability of the housing result, and a better reliability, like e.g. on the JEDEC level (JEDEC=Joint Electronic Device Engineering Council) may be achieved.

With reference to the metal islands of FIG. 6A or FIG. 7A, respectively, it is noted that they may comprise an exterior outline comprising protrusions and retreats or an overgrowth, respectively, for a better anchoring in the cover layer material. This exterior outline offers a better anchoring of the metal islands in the cover layer material.

The above-described method is based on a base plate consisting of copper. As the base plate only illustrates a sacrificial structure, instead of copper any other easily removable material may be used for the base plate 40, preferably a material which is removable using etching. Similar things hold true for the support wafer of FIGS. 1A and 1B, as mentioned above.

For the metal islands and contact bumps instead of using nickel as the base material with a gold plating as a cover any other contact material may be used.

In the described preferred embodiments the photolithographically structurable layers consist of a photosensitive epoxy material which is removed or remains by exposing or not exposing, respectively, parts of the epoxy material. Similarly, it is possible, however, to form the photolithographically structurable layers by any materials which may be etched which are covered with photo masks. Deviating from the above-described preferred embodiments, an enclosure of the manufactured housing structure may be provided using vacuum screen printing or molding.

The invention claimed is:

1. A method for manufacturing a housing for a chip having a micromechanical structure, comprising the following steps:
   (a) providing a first basis which comprises a photolithographically structurable layer on at least a partial region of a main face;
   (b) photolithographically structuring the first photolithographically structurable layer to obtain a cover for the micromechanical structure;
   (c) providing a chip comprising the micromechanical structure, which is arranged at a main face of the chip between the first contact elements;
   (d) applying a second photolithographically structurable layer on at least a partial region of the main face of the chip;
   (e) photolithographically structuring the second photolithographically structurable layer for generating a recess surrounded by a wall in the photolithographically structurable layer in the region of the micromechanical structure and for exposing the first contact elements;
   (f) merging the first basis and the chip in a way so that the micromechanical structure and the cover are facing each other and are aligned with each other, so that the recess is closed by the cover, whereby an on-chip cavity is obtained;
   (g) removing the first basis in order to obtain a chip comprising an on-chip cavity;
   (h) merging a second basis and the chip comprising the on-chip cavity in such a way that the first contact elements are connected to the second basis via a conductive structure; and
   (i) removing the second basis for exposing the conductive structure.

2. The method according to claim 1, wherein the second basis comprises second contact elements on the main face of the second basis, wherein the step (h) is performed such that first and the second contact elements are respectively connected to each other.

3. The method according to claim 1, wherein the second contact elements consist of nickel islands.

4. The method according to claim 1, which further comprises the step of applying soldering pellets onto the third contact elements prior to step (h).

5. The method according to claim 1, wherein the second basis consists of copper.

6. The method according to claim 5, wherein the step (i) includes etching away the second basis.

7. The method according to claim 1, wherein the first and/or the second photolithographically structurable layer consists of a photosensitive epoxy resin.

8. The method according to claim 1, wherein the step (a) comprises applying the first photolithographically structurable layer on at least a partial region of a main face of a first basis, on which already a sacrificial layer is located and wherein the step (g) comprises etching away the sacrificial layer.

9. The method according to claim 1, wherein the step (h) is performed such that after merging a gap between the cover and the second basis results.

10. The method according to claim 1, wherein the step (h) is performed such that after merging the cover and the second basis contact each other.

11. The method according to claim 1, further comprising the step of closing the structure resulting after step (h) from the chip comprising the on-chip cavity and the second basis comprising a covering layer, whereby after step (i) the conductive structure is exposed at an exposed main face of the structure close by the step of closing.

12. The method according to claim 11, wherein the covering layer consists of a plastics material.

13. The method according to claim 1 which comprises providing a stud bumping structure on the first contact elements prior to step (h).

* * * * *